United States Patent
König et al.

(10) Patent No.: US 10,324,136 B2
(45) Date of Patent: *Jun. 18, 2019

(54) METHOD AND DEVICE FOR TESTING ELECTRICAL ENERGY STORING SYSTEMS FOR DRIVING VEHICLES

(71) Applicant: AVL LIST GMBH, Graz (AT)

(72) Inventors: Oliver König, Graz (AT); Stefan Jakubek, Vienna (AT); Günter Prochart, Graz (AT); Kurt Gschweitl, Eggersdorf (AT)

(73) Assignee: AVL LIST GMBH, Graz (AT)

( * ) Notice: Subject to any disclaimer, the term of this patent is extended or adjusted under 35 U.S.C. 154(b) by 1026 days.

This patent is subject to a terminal disclaimer.

(21) Appl. No.: 14/402,841

(22) PCT Filed: May 24, 2013

(86) PCT No.: PCT/EP2013/060725
§ 371 (c)(1),
(2) Date: Nov. 21, 2014

(87) PCT Pub. No.: WO2013/174972
PCT Pub. Date: Nov. 28, 2013

(65) Prior Publication Data
US 2015/0112620 A1    Apr. 23, 2015

(30) Foreign Application Priority Data
May 24, 2012  (AT) ............... A 50201/2012

(51) Int. Cl.
*G01R 31/367*  (2019.01)
*G01R 31/387*  (2019.01)
(Continued)

(52) U.S. Cl.
CPC ........... *G01R 31/367* (2019.01); *B60L 58/12* (2019.02); *G01R 31/3647* (2019.01);
(Continued)

(58) Field of Classification Search
CPC ...... H01M 4/02; B60L 58/12; B60L 2210/30; B60L 2240/547; B60L 2240/549;
(Continued)

(56) References Cited

U.S. PATENT DOCUMENTS 4,274,043 A  *  6/1981  Heitz ................ H01M 10/4207
                                                          307/151
5,208,526 A  *  5/1993  Goldman ................ H01M 4/02
                                                          320/128
(Continued)

FOREIGN PATENT DOCUMENTS

JP    10144355    5/1998
JP    10232273    9/1998
(Continued)

OTHER PUBLICATIONS

Machine Translation of KR 1020110111018.
(Continued)

*Primary Examiner* — Alexander Satanovsky
(74) *Attorney, Agent, or Firm* — Whitmyer IP Group LLC (57) ABSTRACT

A method for testing electrical energy storage systems for driving vehicles provides that the load current of the energy storage system traces by means of a control loop, if possible without delay, a reference current that varies over time according to predetermined test cycles. The control loop is created by means of a model-based controller design method in which a model of the impedance of the energy storage system is integrated in the model of the controlled system.

13 Claims, 5 Drawing Sheets

(51) Int. Cl.
- *G01R 31/36* (2019.01)
- *G01R 31/389* (2019.01)
- *H02M 3/158* (2006.01)
- *B60L 58/12* (2019.01)

(52) U.S. Cl.
CPC ........ *G01R 31/387* (2019.01); *H02M 3/1584* (2013.01); *B60L 2210/30* (2013.01); *B60L 2240/547* (2013.01); *B60L 2240/549* (2013.01); *G01R 31/389* (2019.01); *Y02T 10/7005* (2013.01); *Y02T 10/705* (2013.01); *Y02T 10/7044* (2013.01); *Y02T 10/7241* (2013.01)

(58) Field of Classification Search
CPC .............. G01R 31/387; G01R 31/3647; G01R 31/367; G01R 31/389; H02M 3/1584; Y02T 10/7044; Y02T 10/7005; Y02T 10/7241; Y02T 10/705
USPC ..... 702/58, 60, 63, 120, 136, 157, 158, 188; 307/151; 320/128
See application file for complete search history.

(56) References Cited

U.S. PATENT DOCUMENTS

| | | | |
|---|---|---|---|
| 6,301,281 | B1 | 10/2001 | Deng et al. |
| 6,577,107 | B2 | 6/2003 | Kechmire |
| 2003/0184307 | A1 | 10/2003 | Kozlowski et al. |
| 2003/0204328 | A1 | 10/2003 | Tinnemeyer |
| 2006/0284617 | A1 | 12/2006 | Kozlowski et al. |
| 2007/0236181 | A1 | 10/2007 | Palladino |
| 2011/0054816 | A1 | 3/2011 | Prada et al. |
| 2012/0078552 | A1 | 3/2012 | Mingant et al. |

FOREIGN PATENT DOCUMENTS

| | | |
|---|---|---|
| JP | 2003217683 | 7/2003 |
| JP | 2007292778 | 11/2007 |
| JP | 2010151592 | 7/2010 |
| KR | 1020110111018 | 10/2011 |

OTHER PUBLICATIONS

Konig et al., "Model Predictive Control of a Battery Emulator for Testing of Hybrid and Electric Powertrains" in 2011 IEEE, Vehicle Power and Propulsion Conference.
English Abstract of JP2007292778.
Ersglish Abstract of JP2003217683.
English Abstract of JPH10232273.
English Abstract of JPH10144355.
E. Batailer-Planes et al., "Power Balance of a Hybrid Power Source in a Power Plant for a Small Propulsion Aircraft," IEEE Transactions on Power Electronics, vol. 24, No. 12, Dec. 2009, pp. 2856-2866.
English Abstract of JP 2010151592.

* cited by examiner

Fig. 9

METHOD AND DEVICE FOR TESTING ELECTRICAL ENERGY STORING SYSTEMS FOR DRIVING VEHICLES

TECHNICAL FIELD

The invention relates to a method and a device by means of which in the battery tester, in the course of the current control, the actual load current traces, as exact as possible and without delay, a reference current that varies over time.

BACKGROUND

When testing hybrid vehicle or even completely electrically driven vehicles, testing the traction battery is of particular importance. In the process of this, the test current should follow predetermined test cycles with highly-dynamic transients as exact as possible and without delay. This can be achieved via an adequate control loop which is created by means of a model-based controller design method.

The current control is not to be influenced by the unit under test, if possible. However, since the counter-voltage of the device under test depends substantially on the impressed current, i.e., the controlled variable, the latter has a significant influence on the dynamic properties of the control loop. In order to reduce this influence, there is a plurality of possibilities. On the one hand, the power electronics can be designed to have an output impedance as high as possible. However, this results in a reduction of the achievable control bandwidth and involves increased material costs and increased space requirement because this requires larger inductors. In the method of feedforward disturbance control, the measured counter voltage of the unit under test is regarded as a disturbance variable and is used for compensating the disturbance. In this case, however, it is assumed that the disturbance variable is independent of the controlled variable. However, due to the finite battery impedance, the terminal voltage of a battery depends in fact on the impressed current. The behavior of the disturbance variable in response to changes in the impressed current thus cannot be predictively compensated.

SUMMARY

An object of the present invention therefore was an improvement of the aforementioned method and the device in such a manner that the load no longer represents an unknown variable, but can explicitly be taken into account during the closed-loop control.

The problem of previous systems is that the behavior of the current control depends on the impedance of the battery (UUT). Unfavorable impedance results in slow control behavior and significant overshooting of the test current. Also, impedance changes with age and the state of charge of the battery and depends on the operating point (load current).

The object of the present invention therefore was an improved method and an improved device by means of which in the battery tester, in the course of the current control, the actual load current traces a reference current that varies over time according to predetermined test cycles with the lowest possible delay and as exact as possible, in order to perform the desired test cycles.

In order to achieve this object, the method is characterized in that the control loop is created by means of a model-based controller design method, wherein a model of the impedance of the energy storage system is integrated in the model of the controlled system. The counter-voltage of the battery principally represents a disturbance for the current control. The model for the battery impedance enables an approximate prediction of the course of the disturbance variable in response to the impressed current. Through this, a faster and more robust response of the actual current to changes in the reference current can be achieved.

According to an advantageous variant of the method it is provided that the parameters for a generic model of the battery impedance are identified by at least one short excitation sequence and measurement of the resulting values of current and voltage.

In order to achieve the object, the device for testing electrical energy storage systems for driving vehicles, comprising a control loop for causing the load current of the energy accumulation system to follow, if possible without delay, a reference current that varies over time according to predetermined test cycles, is characterized in that a model-based control is implemented in the control loop and that a model of the battery impedance is integrated in the model thereof.

An advantageous embodiment of the invention is characterized in that a model of the battery impedance is integrated, which model depends on the operating point of the battery.

Alternatively a model of the battery impedance is integrated, which model depends on the state of charge of the battery.

As another alternative, a device according to the invention could be characterized in that a model of the battery impedance is integrated, which model depends on the age of the battery.

For all of the mentioned variants, an advantageous embodiment is characterized in that a model-based predictive control is implemented in the control loop. The integration is principally possible with any model-based controller design method. The model-based predictive control (MPC) also enables to explicitly taking account physical limitations (e.g. control input limits or current limits for protecting the semiconductor switches in the battery simulator) when optimizing the course of the control input.

The model of the battery impedance is preferably presented as a transfer function of the second or higher order.

In the following description, the invention is explained in greater detail.

BRIEF DESCRIPTION OF THE DRAWINGS

In the figures of the accompanying drawings.

DETAILED DESCRIPTION

Figure 1:
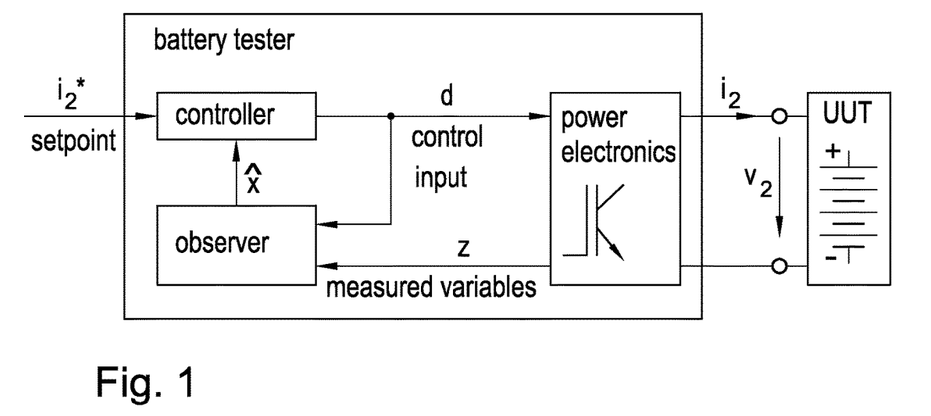
FIG. 1 shows a schematic illustration of a battery tester.

A system exemplary illustrated in FIG. 1 is composed of a unit under test, i.e., the traction battery, and the battery tester. The battery tester in turn is composed of a power electronics and preferably a digital controller. The terminal voltage of the battery is designated here with $v_2$, the load current to be impressed is designated with $i_2$ and the current reference is designated with $i_2^*$. The power electronics is activated by providing a pulse-width-modulated signal (PWM) with the duty cycle d. The measured variables are combined in the measured variable vector d. The controller is preferably configured as a model-predictive controller (MPC) that takes account of control input limitations. A state observer processes the measurement data and the control input output last, and estimates therefrom the state vector that is required by the controller.

Model-predictive controller design methods were selected because therewith, the design can be automated based on a model of the controlled system and because the inherent control input limitation of the power electronics (the duty cycle is only variable in the range 0≤d≤1) can be taken into account.

Figure 2:
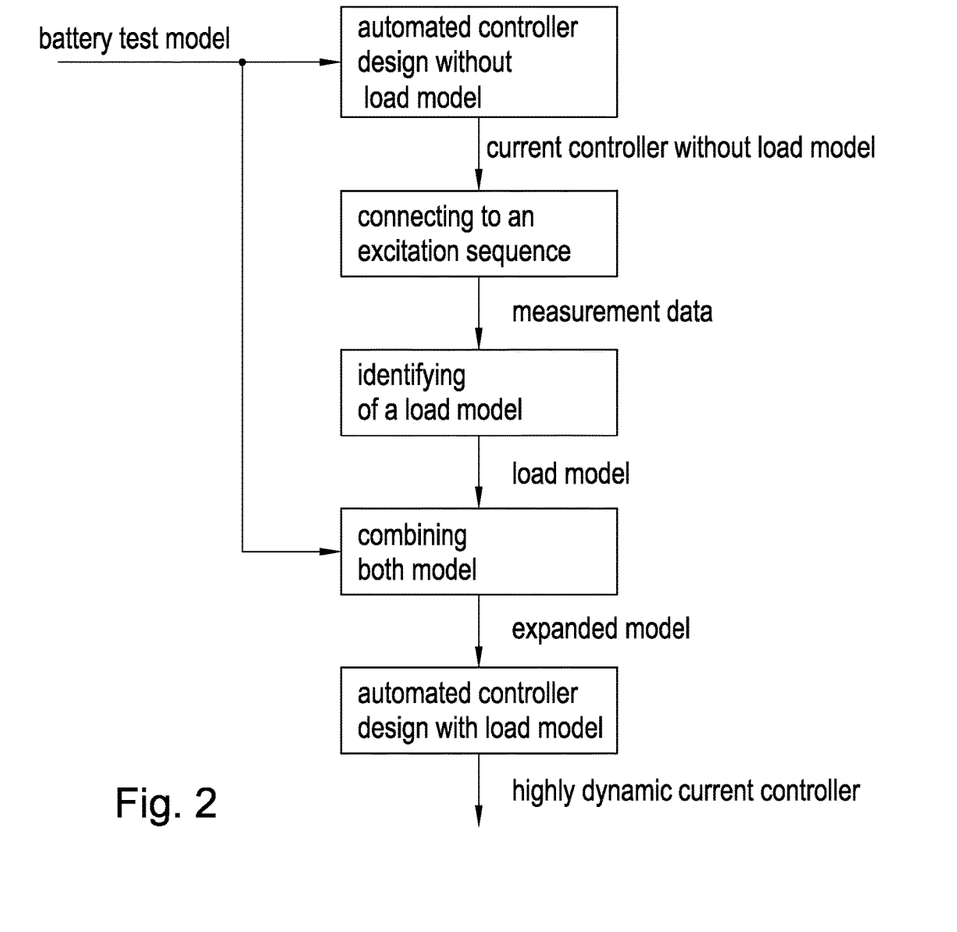
FIG. 2 is a block diagram for the approach of designing a current controller with integrated load model.

By means of a model of the battery tester, a preliminary controller without model of the load is designed. The battery tester is then operated with the preliminary controller when the unit under test is connected. A suitable excitation sequence (e.g., a pseudorandom binary sequence (PRBS)) is used as the reference signal $i_2^*$. The actual load current $i_2$ and the terminal voltage $v_2$ are recorded with the sample rate of the controller. Subsequently, a model of the load is identified based on the measurement data, and the model of the battery tester is finally expanded by the model of the load. With the expanded model of the whole system, a controller is designed again which then can be used to apply highly dynamic test sequences to the unit under test. This process is summarized in the illustration of FIG. 2.

Figure 3:
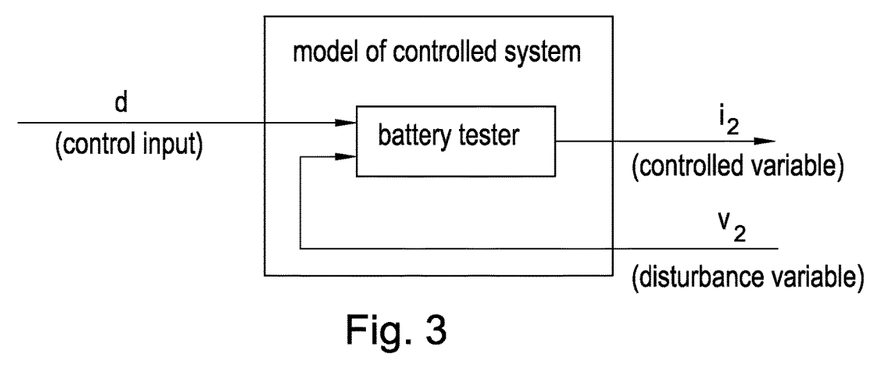
FIG. 3 shows a block diagram of the controlled system.

A model of the controlled system is needed for the above-mentioned controller design. In FIG. 3, the controlled system is illustrated as a block diagram, without taking account of the load. The duty cycle d functions as control input, the load current $i_2$ is the controlled variable and the terminal voltage $v_2$ of the battery is interpreted as the disturbance variable. The future course of this disturbance variable is not known, i.e., the controller can only respond when the disturbance variable has already changed.

Figure 4:
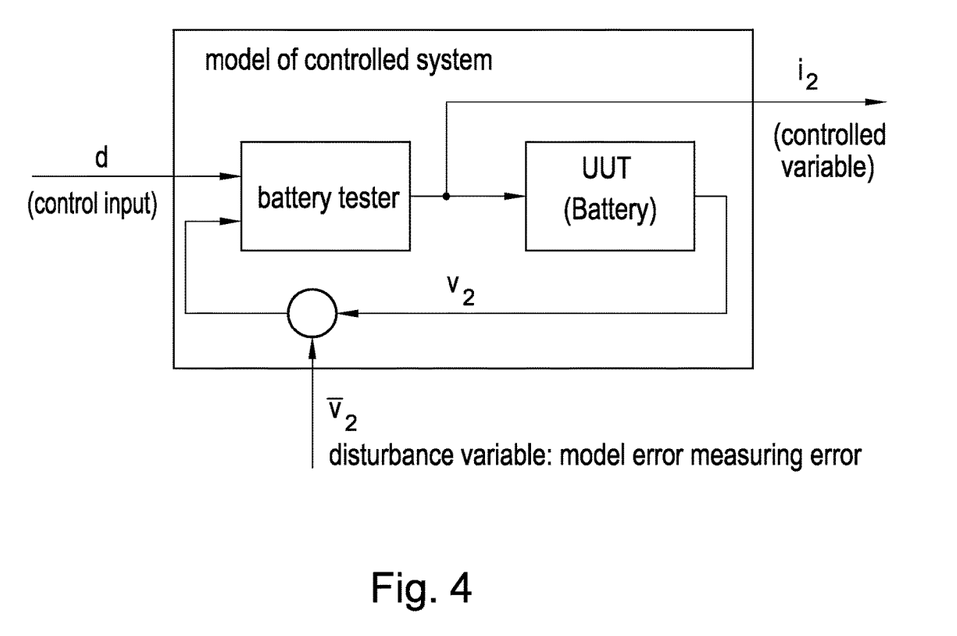
FIG. 4 illustrates a block diagram of the controlled system with included load model.

If a model of the battery is available, it can be integrated in the model of the controlled system. The resulting block diagram is illustrated in FIG. 4. Because of this, the terminal voltage is no longer regarded as the disturbance variable but instead as a new state variable of the expanded system. Thereby, at least those future changes in the terminal voltage can be estimated that are caused by changes of the impressed test current—provided that the load model is sufficiently accurate. Measurement errors and errors in the load model are still regarded as disturbance variable. Consequently, two separate models, one of the load and one of the battery tester, are needed.

Figure 5:
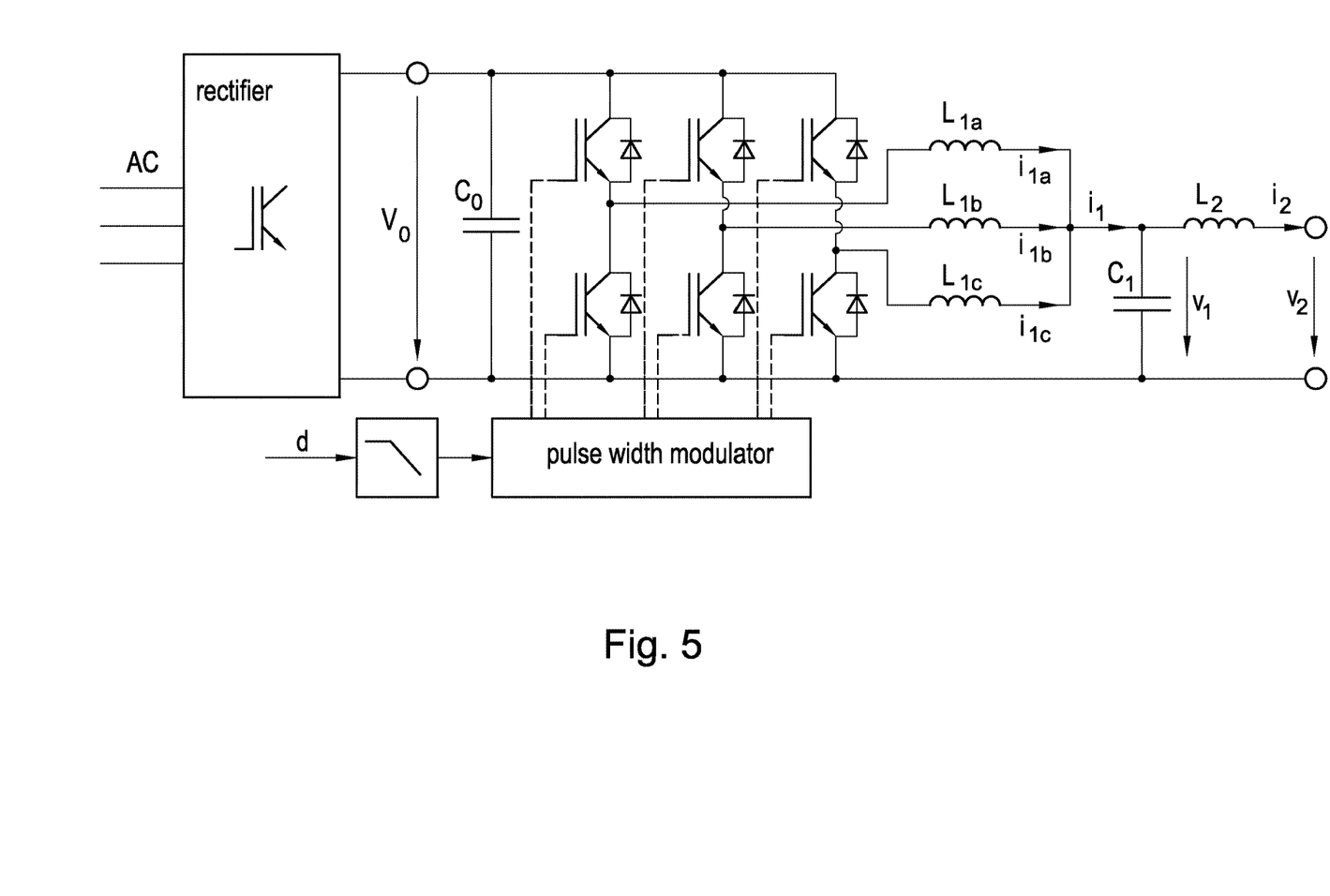
FIG. 5 shows a circuit diagram of the power electronics.

The battery tester used is composed of a controlled buck converter having three IGBT half bridges that are connected offset with respect to one another. A simplified circuit diagram of the output stage with the relevant components is illustrated in FIG. 5.

The dynamic of the system is determined by the passive output filter. The latter is composed of the three storage chokes $L_{1a}$, $L_{1b}$ and $L_{1c}$, the filter capacitor $C_1$ and the filter choke $L_2$. When all three storage chokes have the same inductance, $L_{1a}=L_{1b}=L_{1c}$, the dynamic behavior of the output stage can then be approximated with a model of a single-phase buck converter composed of only one half bridge and one storage choke $L_1=\frac{1}{3}L_{1a}=\frac{1}{3}L_{1b}=\frac{1}{3}L_{1c}$.

For the single-phase output filter it is now possible to form a continuous-time state space representation with the state vector $\dot{x}_c=[i_1 \ v_1 \ i_2]^T$:

$$\dot{x}_c = \underbrace{\begin{bmatrix} -\frac{R_{L1}}{L_1} & -\frac{1}{L_1} & 0 \\ \frac{1}{C_1} & 0 & -\frac{1}{C_1} \\ 0 & \frac{1}{L_2} & -\frac{R_{L2}}{L_2} \end{bmatrix}}_{A_c} x_c + \underbrace{\begin{bmatrix} \frac{1}{L_1} \\ 0 \\ 0 \end{bmatrix}}_{B_c} dV_0 + \underbrace{\begin{bmatrix} 0 \\ 0 \\ -\frac{1}{L_2} \end{bmatrix}}_{E_c} v_2 \quad (1)$$

$$i_2 = \underbrace{[0 \ 0 \ 1]}_{C_c} x_c.$$

The duty cycle d and the terminal voltage $v_2$ are the model inputs (as control input or disturbance variable). The variables $i_1$, $i_2$ and $v_2$ are available to the controller as measured variables. If the capacitor voltage $v_1$ is not measured, a state observer is necessary so as to continuously reconstruct the momentary state vector.

For the time-discrete digital controller, a corresponding time-discrete model of the battery tester is required. For this purpose, the PWM is approximated by a zero-order hold (ZOH). The resulting model can be expressed with the transition matrix $A_d$, the input matrix $B_d$, the disturbance input matrix $E_d$ and the output matrix $C_d$ as a state space model:

$$x_{ck+1}=A_d \cdot x_{ck}+B_d \cdot d_k V_0+E_d \cdot v_{2k} i_{2k}=C_d \cdot x_{ck} \quad (2)$$

The index k designates in each the current time step.

The conversion into the time discrete model is done with standard steps, for example with the MATLAB command c2d.m. Due to the required computation time of the controller, the calculated new value of the control input cannot be applied immediately, but always only at the next sampling time. This circumstance is taken into account by expanding the state space model by an additional delay of one sampling period. The resulting model of the battery tester is independent of the connected load and has to be formed only once for each battery tester and remains unchanged thereafter.

Batteries exhibit principally a very complex dynamic behavior that depends on many factors—in particular on the state of charge, the cell temperatures and the charge and/or discharge current. Accordingly, complex models are required in order to be able to reconstruct and/or predict this behavior.

The electrical and electrochemical effects which are responsible for the dynamic behavior of a battery have different time constants. For controlling the battery tester, the effects having small time constants are important. These are specifically the supply line resistances and contact resistances, the inductances of the supply lines and contacts as well as capacitive effects. Effects having a large time constant represent disturbance variables which vary slowly and can be easily compensated by a fast controller.

For this reason, a greatly simplified model in which only the fast effects are presented is sufficient for controlling the test current. Moreover, the order of the embedded load model has an influence on the computing effort during the runtime of the control. As a result, the usable model order is greatly limited by the available computing capacity and the sampling rate.

For the described trials, a model of the second order was selected that is expressed as general time-discrete transfer function $Z(z)$ with the z-transformed test current $I_2(z)$ as input and the z-transformed terminal voltage $V_2(z)$ as output:

$$Z(z) = \frac{V_2(z)}{I_2(z)} = \frac{b_0 + b_1 z^{-1} + b_2 z^{-2}}{1 + a_1 z^{-1} + a_2 z^{-2}} \quad (3)$$

The free parameters of the transfer function are combined in the parameter vectors $\theta_a = [a_1 \ a_2]$ and $\theta_b = [b_0 \ b_1 \ b_2]$.

With the controllable canonical form, this transfer function can be brought into an equivalent state space representation:

$$x_{Lk+1} = \underbrace{\begin{bmatrix} 0 & 1 \\ -a_2 & -a_1 \end{bmatrix}}_{A_L} \cdot x_{Lk} + \underbrace{\begin{bmatrix} 0 \\ 1 \end{bmatrix}}_{B_L} \cdot i_{2k} \quad (4)$$

$$v_{2k} = \underbrace{[\, b_2 - a_2 b_0 \quad b_1 - a_1 b_0 \,]}_{C_L} \cdot x_{Lk} + b_0 \cdot i_{2k} \quad (5)$$

Now, the unknown parameters have to be determined by means of an identification method. A method that is possible for this purpose is exemplary described below.

The unit under test is acted on with a load current excitation sequence by means of a controller based on the model of the battery tester without load model. The voltage and current values recorded at the same time are combined in the measurement data vectors $i_2$ (input data) and $v_2$ (output data). N is the number of elements of the two vectors (=length of the excitation sequence in sampling steps).

As a starting basis, a rough estimation of model parameters is generated with the tool ident.m from the MATLAB identification tool box. First, the respective arithmetic average is subtracted from the measurement data vectors. In addition, the data is filtered with a low pass filter in order to eliminate high-frequency disturbances. Then, the tool is used to estimate the parameter vectors $\theta_a$, $\theta_b$ for an ARX model with denominator and numerator degree 2.

Subsequently, with the estimated parameter set, the response $\tilde{v}_2$ of the model to the measured current curve $i_2$ can be simulated and can be compared with the measured voltage curve $v_2$. If a significant difference is found between the measured and the simulated voltage curve, the parameters can be improved by means of optimization.

The goal of optimization is to minimize the sum of squared errors J as function of the model parameters $\theta_a$, $\theta_b$:

$$\min J(\theta_a, \theta_b)$$

With $J(\theta_a, \theta_b) = e(\theta_a, \theta_b)^T \cdot e(\theta_a, \theta_b)/N$ and $e(\theta_a, \theta_b) = v_2 - \tilde{v}_2(\theta_a, \theta_b)$, wherein $\tilde{v}_2(\theta_a, \theta_b)$ is the respective simulation result for the parameters $\theta_a$, $\theta_b$ with the input signal $i_2$.

As an alternative, other identification methods can also be used (e.g. output error methods (OE)) which provide a model having the above-described structure.

The two previously described sub-models still have to be combined so as to form a model of the controlled system.

For this purpose, an expanded state vector is used, which is composed of the state vectors of the sub-models $x_{Lk} = [x_{dk}^T \ x_{Lk}^T]^T$. By connecting the output $i_{2k} = C_d \cdot x_{ck}$ of the battery tester model to the input $i_{Lk}$ of the load model and by connecting the output $v_{2k} = C_L \cdot x_{Lk} + b_0 \cdot i_{2k}$ of the load model to the disturbance input $v_{2k}$ of the battery tester, the following expanded state space model is formed:

$$\begin{bmatrix} x_{dk+1} \\ x_{Lk+1} \end{bmatrix} = \underbrace{\begin{bmatrix} A_d + E_d b_0 C_d & E_d C_L \\ B_L C_d & A_L \end{bmatrix}}_{A} \cdot \underbrace{\begin{bmatrix} x_{dk} \\ x_{Lk} \end{bmatrix}}_{x_k} + \underbrace{\begin{bmatrix} B_d \\ 0 \end{bmatrix}}_{B} \cdot d_k V_0 + \underbrace{\begin{bmatrix} E_d \\ 0 \end{bmatrix}}_{E} \cdot \tilde{v}_{2k} \quad (6)$$

$$v_{2k} = \underbrace{[\, C_d \quad 0 \,]}_{C} \cdot \begin{bmatrix} x_{dk} \\ x_{Lk} \end{bmatrix}$$

This expanded model can also be created in MATLAB with the command connect. m.

The illustrated model was used for the trials described below. However, it has to be taken into account that for the case $b_0 \neq 0$, this model applies only approximately. A better description of the behavior of the expanded controlled system could be achieved if $b_0$ would already be taken into account in the continuous-time model of the battery tester. Because of the expansion of the state vector, both the controller and the observer have to be designed for the expanded model.

Figure 6:
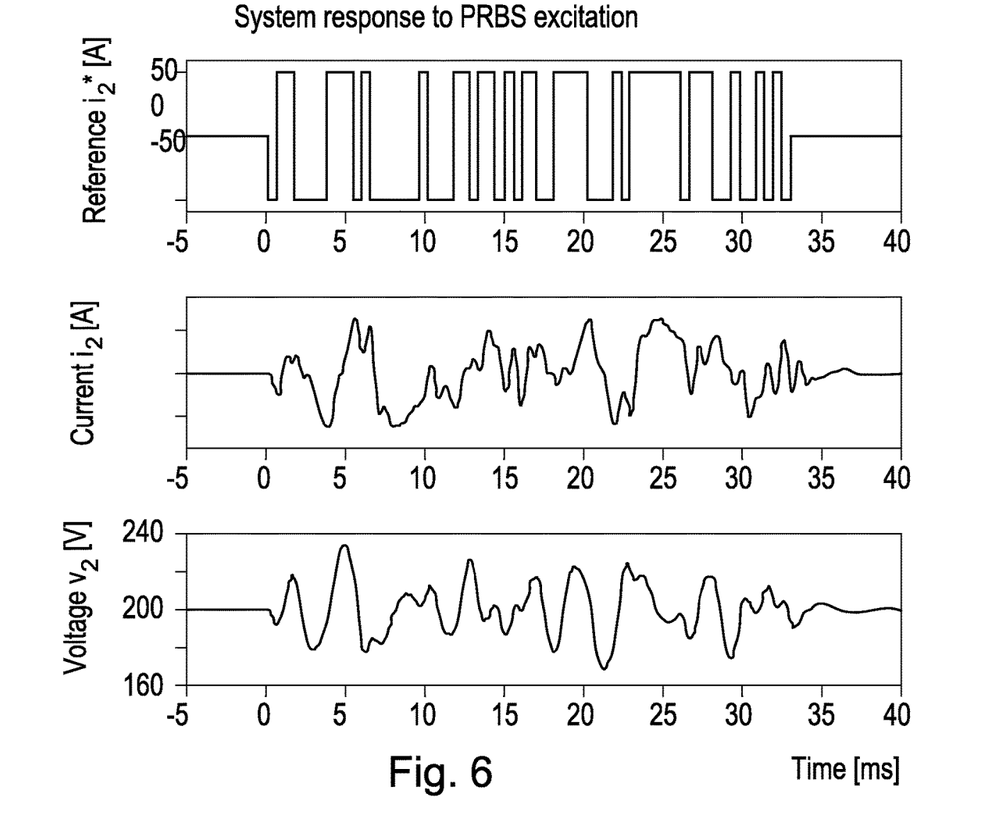
FIG. 6 shows a system response of the system according to the invention to an excitation sequence, with illustration of the predetermined excitation sequence and the resulting measured values for current and voltage during operation with the preliminary controller without load model.

The described method was tested on a testing plant. A traction battery was not available as unit under test so that a battery simulator was used as the test load. It should be noted that the battery simulator has been operated with a relatively slow controller as a constant voltage source. The dynamic behavior thereof differs significantly from that of a battery. Nevertheless, at least the basic feasibility could be shown. The upper diagram of FIG. 6 shows the PRB sequence, the one in the middle shows the controlled test current and the lower diagram shows the resulting terminal voltage.

Figure 7:
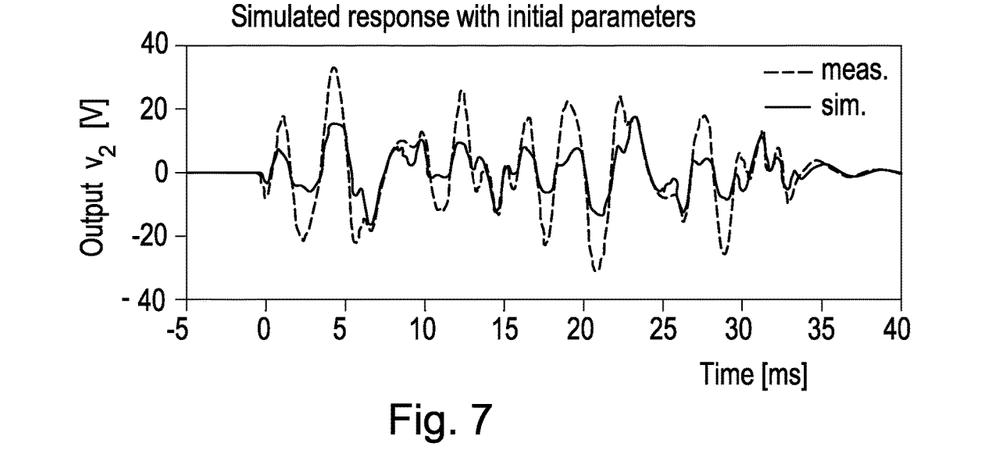
FIG. 7 shows a diagram for the simulated system response.

As is apparent from FIG. 7, which illustrates the simulated output voltage for the parameters which, for example, were determined with the MATLAB command ident.m, the behavior of the system is only insufficiently reproduced in this manner. However, the parameters used here served as initial values for the optimization of the parameters.

Figure 8:
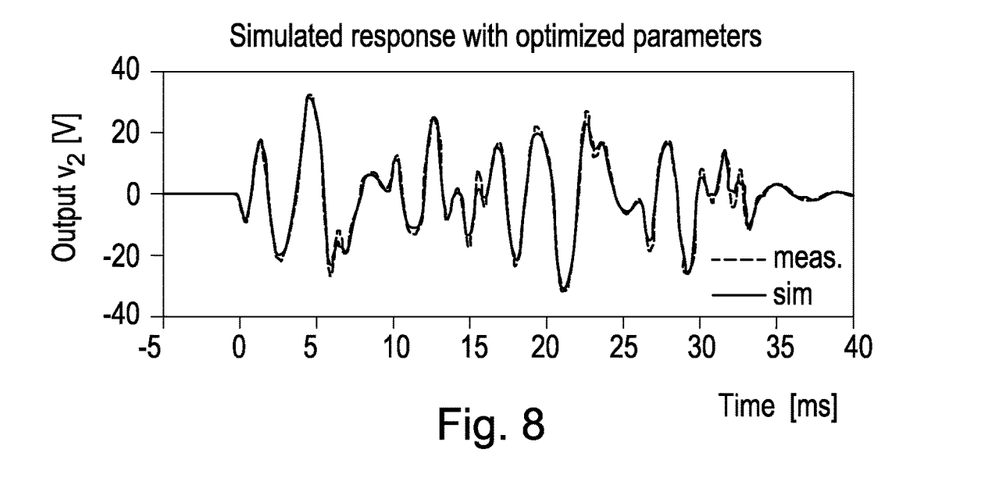
FIG. 8 is an illustration of the simulated system response with optimized parameters in comparison with the recorded system response, and FIG. 9 finally shows a comparison of the system responses to a jump of the reference variable from 40 A to 80 A in the case of current control with and without load model.

After optimizing the parameters, however, the simulated system response of FIG. 8 is obtained, wherein a significantly better correlation with the measured data could be achieved for the simulated output voltage. The parameters used here were used for designing the controller with load model.

Figure 9:
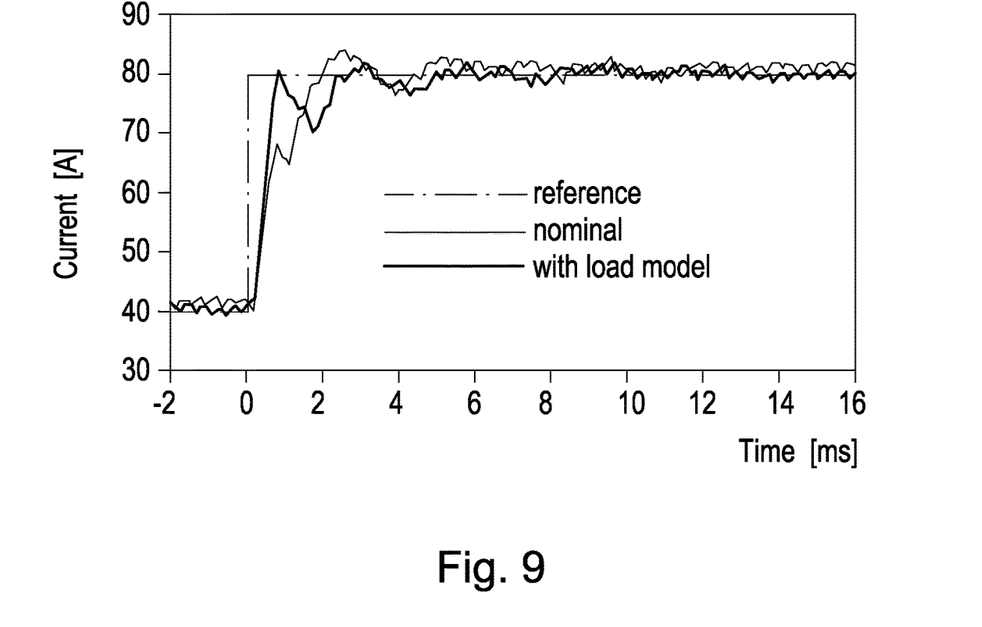

FIG. 9 finally shows the measured response of the test current to a setpoint step when using the controller without (blue) and with (red) load model. The controller with load model reaches the setpoint faster, and the overshoot is smaller compared with the controller without load model. However, after the first increase in current, short undershooting occurs.

The described method offers the possibility to expand a model-predictive current controller of a battery tester by a model of the load and thereby to improve the dynamic of the current control for a particular unit under test. Due to the use of a generic load model, the application is not limited to batteries, but can also be applied to other loads.

The model parameters are preferably constantly estimated during operation (e.g. with recursive least squares (RLS)) if the dynamic of the load changes excessively during operation. Then, the controller is also constantly redesigned during run time using the variable parameters.

The invention claimed is:

1. A method for testing electrical energy storage systems for driving vehicles, comprising:
   generating a load current of the energy storage system with a battery tester;
   measuring the load current of the energy storage system using a sensor;
   providing a reference current;
   controlling the load current of the energy storage system so that a difference between the load current and the reference current is minimized by using a control loop with a model of the battery tester;
   wherein the control loop is created by means of a model-based controller design method, in which a model of the energy storage system as a load is integrated in the model of the battery tester.

2. The method according to claim 1, further comprising:
   connecting the electrical energy storage system as the load to the battery tester;
   applying an excitation sequence to the electrical energy storage system by the battery tester by means of a preliminary controller without a load model;
   acquiring measurement data at the electrical energy storage system;
   identifying from said measurement data a load model by means of an identification method; and
   integrating the identified load model into the model of the battery tester.

3. The method according to claim 1, further comprising:
   identifying parameters for a generic model of a battery impedance by at least one short excitation sequence and measurement of the resulting values of current and voltage.

4. A device for testing electrical energy storage systems for driving vehicles, comprising:
   a battery tester for generating a load current of the energy storage system;
   a sensor for taking a measurement of the load current of the energy storage system;
   a control loop, including computer instructions executing on a computer readable medium, with a model of the battery tester, the control loop adapted to minimize a difference between the measurement of the load current of the energy storage system and a reference current;
   wherein a model-based control is implemented in the control loop and, in a model of the model-based control, a model of the energy storage system as a load is integrated.

5. The device according to claim 4, wherein a model of a battery impedance is integrated, which model depends on an operating point of a battery.

6. The device according to claim 4, wherein a model of a battery impedance is integrated, which model depends on a state of charge of a battery.

7. The device according to claim 4, wherein a model of a battery impedance is integrated, which model depends on an age of a battery.

8. The device according to claim 4, wherein a model-based predictive control is implemented in the control loop.

9. The device according to claim 4, wherein a model of a battery impedance is represented as a transfer function of second or higher order.

10. The device according to claim 4, further comprising a controller having a processor, the controller implementing the model-based control.

11. The device according to claim 10, wherein model parameters are constantly estimated during operation and the controller is constantly redesigned using the estimated model parameters.

12. The device according to claim 4, wherein the battery tester comprises a controlled buck converter having three IGBT half bridges.

13. The device according to claim 4, wherein a current control is not influenced by a unit under test.

* * * * *